US009720042B2

(12) United States Patent
Chiu et al.

(10) Patent No.: US 9,720,042 B2
(45) Date of Patent: Aug. 1, 2017

(54) BUILT-IN TEST FOR SATELLITE DIGITAL PAYLOAD VERIFICATION

(71) Applicant: The Boeing Company, Chicago, IL (US)

(72) Inventors: Robert Conder Chiu, Redondo Beach, CA (US); Robert Emerson Bolton, Rancho Palos Verdes, CA (US); Payman Behboudikha, Tarzana, CA (US); Philip Stewart Jaque, Rancho Palos Verdes, CA (US)

(73) Assignee: The Boeing Company, Chicago, IL (US)

( * ) Notice: Subject to any disclaimer, the term of this patent is extended or adjusted under 35 U.S.C. 154(b) by 68 days.

(21) Appl. No.: 14/283,950

(22) Filed: May 21, 2014

(65) Prior Publication Data

US 2015/0339205 A1 Nov. 26, 2015

(51) Int. Cl.
*G01R 31/28* (2006.01)
*G01R 31/3187* (2006.01)
*G06F 11/263* (2006.01)
*B64G 1/00* (2006.01)
*G06F 11/27* (2006.01)

(52) U.S. Cl.
CPC ........... *G01R 31/3187* (2013.01); *B64G 1/00* (2013.01); *G06F 11/263* (2013.01); *G06F 11/27* (2013.01)

(58) Field of Classification Search
CPC ....... G01R 31/3187; B64G 1/00; G06F 11/27; G06F 11/263
See application file for complete search history.

(56) References Cited

U.S. PATENT DOCUMENTS

| | | | |
|---|---|---|---|
| 7,519,880 B1 | 4/2009 | Johnson et al. | |
| 2009/0028574 A1* | 1/2009 | Dybsetter | H04B 10/40 398/135 |
| 2011/0035095 A1* | 2/2011 | Chinnadurai | G07C 5/0808 701/31.4 |
| 2014/0019817 A1 | 1/2014 | Park et al. | |

(Continued)

OTHER PUBLICATIONS

Guangquan et al.; "Design and Implementation of Satellite Payload Data Loader"; 11th Int'l Conf. on Electronic Measurement & Instruments; vol. 1 No. 16; Aug. 2013; p. 216-220.

(Continued)

*Primary Examiner* — April Y Blair
*Assistant Examiner* — Thien D Nguyen
(74) *Attorney, Agent, or Firm* — Baker & Hostetler LLP

(57) ABSTRACT

According to an embodiment, a testing system for a satellite payload includes a built-in testing component configured at a satellite, the built-in testing component comprising a built-in testing component input and a built-in testing component output, and a payload component configured at the satellite, the payload component comprising a payload component input communicatively connected to the built-in testing component output and a payload component output communicatively connected to the built-in testing component input, wherein the built-in testing component is configured to transmit a digital test signal from the built-in testing component output to the payload component input and receive a digital output signal at the built-in testing component input from the payload component output.

20 Claims, 3 Drawing Sheets

(56) References Cited

U.S. PATENT DOCUMENTS

| | | | |
|---|---|---|---|
| 2014/0100737 A1* | 4/2014 | Haap | G06F 11/2294 701/31.4 |
| 2014/0229782 A1* | 8/2014 | Rueter | G01R 31/31919 714/733 |
| 2014/0265949 A1* | 9/2014 | Oakley | H02P 29/0044 318/139 |
| 2015/0105973 A1* | 4/2015 | Cicala | G01R 31/007 701/34.4 |

OTHER PUBLICATIONS

European Patent Application No. 15154606.6; Extended Search Report; dated Oct. 14, 2015; 5 pages.

* cited by examiner

BUILT-IN TEST FOR SATELLITE DIGITAL PAYLOAD VERIFICATION

GOVERNMENT LICENSE RIGHTS

This invention was made with Government support under contract number FA8808-10-C-0001 awarded by the Department Of Defense. The Government has certain rights in the invention.

BACKGROUND

Because it is not practical, and may be impossible, to repair components of a satellite payload that is in orbit, payloads and payload components are thoroughly tested and verified prior to the launch of the satellite. A typical verification process for a satellite payload is expensive and time consuming. To ensure the testing environment is as similar to the orbit environment as possible, satellite payloads are tested in a vacuum chamber. The testing equipment used to test the payload is typically located outside of the vacuum chamber. Because the testing equipment is relatively remote from the payload, lengthy cabling and an elaborate thermal maintenance system are used to connect the testing equipment to the satellite payload. This testing configuration introduces measurement uncertainty, which is currently addressed by using even more testing equipment to verify results found using a first set of testing equipment. It may take weeks to set up and configure this costly test equipment. Because such equipment and testing environments are likely limited in number, there may be satellites awaiting testing as others are undergoing testing, slowing down deployment and production. As will be appreciated, this manner of satellite payload testing is inefficient, expensive, and time consuming.

SUMMARY

Illustrative examples of the present invention include, without limitation, systems and methods for built-in testing of satellite payload components. In one aspect, a method of testing a payload component configured at a satellite may include transmitting, from a built-in testing component comprising a built-in testing component input and a built-in testing component output, a digital test signal from the built-in testing component output to a payload component input and receiving, at the built-in testing component input from a built-in testing component output, a digital output signal. In this example, the built-in testing component and the payload component are both configured at the satellite and the payload component input is communicatively connected to the built-in testing component output and the payload component output is communicatively connected to the built-in testing component input.

In another aspect, a testing system for a satellite payload may include a built-in testing component configured at a satellite, the built-in testing component including a built-in testing component input and a built-in testing component output, and a payload component configured at the satellite, the payload component including a payload component input communicatively connected to the built-in testing component output and a payload component output communicatively connected to the built-in testing component input. The built-in testing component may be configured to transmit a digital test signal from the built-in testing component output to the payload component input and receive a digital output signal at the built-in testing component input from the built-in testing component output.

In another aspect, a testing system for a satellite payload may include a plurality of built-in testing components configured at a satellite, where each of the plurality of built-in testing components includes a built-in testing component input and a built-in testing component output. A payload component may also be configured at the satellite, where the payload component includes a plurality of payload component inputs each communicatively connected to a respective one of the built-in testing component outputs and a plurality of payload component outputs each communicatively connected to a respective one of the built-in testing component inputs. Each of the plurality of built-in testing components may be configured to transmit a digital test signal from its built-in testing component output to a respective payload component input and receive a digital output signal at its built-in testing component input from a respective built-in testing component output.

Other features of the inventive systems and methods are described below. The features, functions, and advantages can be achieved independently in various examples or may be combined in yet other examples, further details of which can be seen with reference to the following description and drawings.

BRIEF DESCRIPTION OF DRAWINGS

Examples of techniques in accordance with the present disclosure are described in detail below with reference to the following illustrations.

DETAILED DESCRIPTION

Current satellite testing methods require the use of test equipment in an adjacent space outside of a satellite testing vacuum chamber. Because of this configuration, these testing methods also require very long cables between the testing equipment and the satellite components being tested. Therefore, additional testing equipment must be used to compensate for the measurement uncertainty introduced by this testing method. Furthermore, individual components are tested serially due to the expense and limited availability of testing equipment, thereby increasing testing time and expense. In order to address these shortcomings, in an example, one or more built-in test components may be configured on a satellite as part of the payload that may be used to perform testing of other satellite components in the payload. The built-in test component may generate a signal that is input to, and receive output from, one or more satellite components, thus providing a test signal that is very close to the tested satellite component and generated within the same environment in which the satellite component is located. There may be multiple built-in test components configured on a satellite, enabling the simultaneous testing of multiple satellite components. Thus, the presently disclosed examples reduce the costs and time for testing satellite components, which is a significant part of the time and expense of preparing a satellite for orbit.

Figure 1:
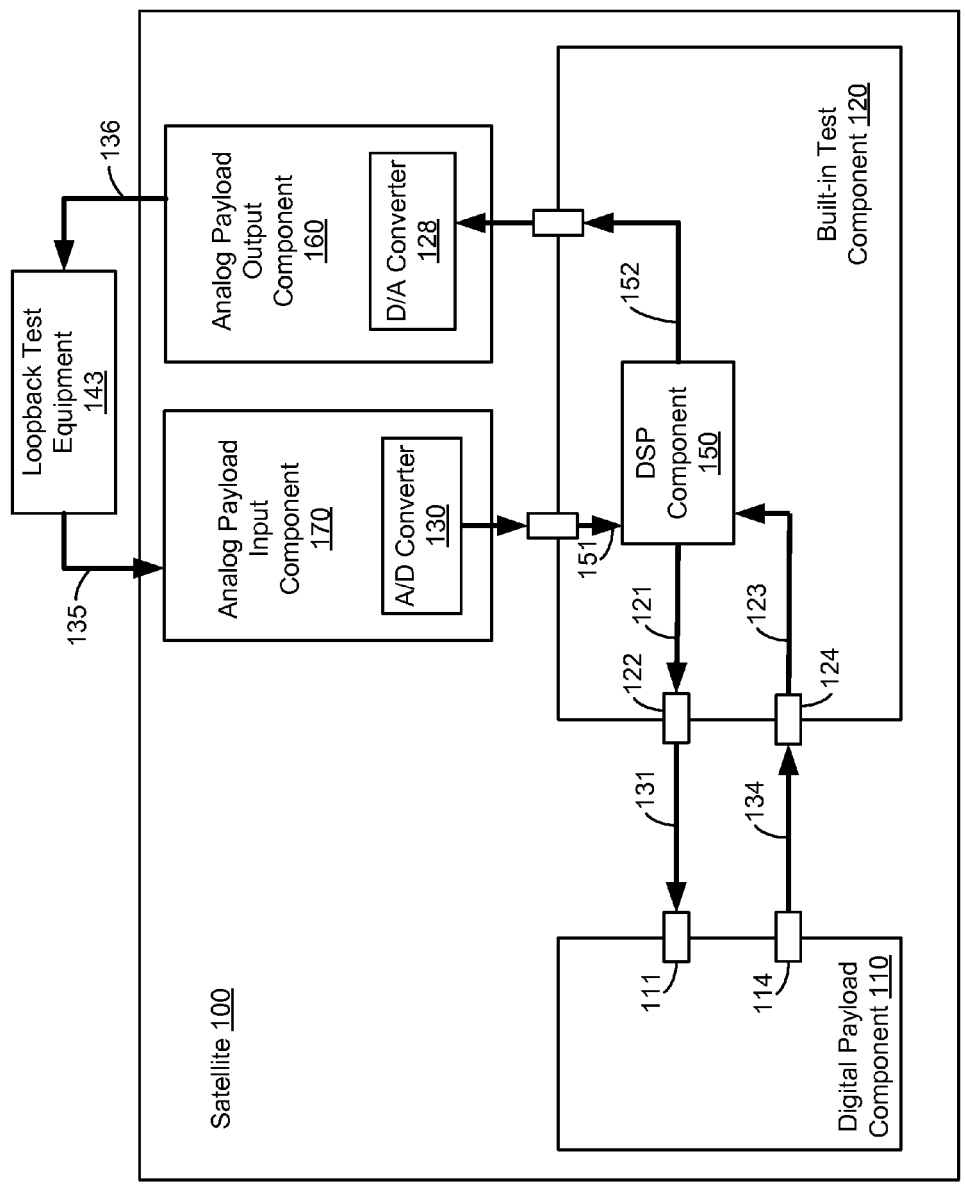
FIG. 1 depicts an example system for built-in testing of satellite payloads.

FIG. 1 illustrates example satellite 100 that may be configured with example built-in test component 120. Built-in test component 120 may be permanently or detachably affixed to, or configured within, satellite 100. Also configured within satellite 100 may be digital payload component 110. Digital payload component 110 may be any type and number of payload components that may be configured in a satellite and that accepts digital input and produces digital output. Also configured within satellite 100 may be analog payload input component 170 and analog payload output component 160. While these components are separated in the figure for ease of explanation, in many examples these components may be within a single housing that may also include other components. Analog payload input component 170 and analog payload output component 160 may each be any type and number of payload components that may be configured in a satellite and that accept analog input and produce analog output. Analog payload input component 170 may be configured with analog-to-digital (A/D) converter 130, and analog payload output component 160 may be configured with digital-to-analog (D/A) converter 128.

Typical measurement and testing equipment as known to those skilled in the art may be configured external to satellite 100 for purposes of verifying and/or comparing to testing results determined by built-in test component 120. In some examples, such external devices may be configured outside of a vacuum chamber in which satellite 100 may be placed to facilitate testing. As an example of such external devices, loopback test equipment 143 may receive output from analog payload output component 160 as analog signal 136 and may feed the received signal back to analog payload input component 170. Thus, loopback test equipment 143 provides an identical, or substantially identical, analog signal to the analog payload components as that received by loopback test equipment 143 from the analog payload components. Alternatively, or in addition, loopback test equipment 143 may serve as an external stimulus device, generating signal 135 that may be used as testing input by analog payload components and may evaluate received signal 136 for comparison purposes and to perform any testing that may be done. Note that in other embodiments, external devices such as loopback test equipment 143 may be configured external to satellite 100 but within a vacuum chamber in which satellite 100 may be placed, thereby reducing potential measurement uncertainties that may impact signals 135 and 136. All such examples are contemplated as within the scope of the present disclosure.

Built-in test component 120 may be configured to provide and receive testing data and signals needed to test the payload components of satellite 100. To test the digital payload components, software configured in built-in test component 120 may instruct, control, or otherwise cause DSP component 150 to generate a digital test signal 121 that may be provided to built-in test component output 122, which may relay the signal as digital output signal 131 to digital payload component 110 via digital payload component input 111. After performing any processing of the signal, digital output signal 134 may be transmitted from digital payload component 110 via digital payload component output 114 to built-in test component input 124 and then to DSP component 150. DSP component 150 may perform any measurements and testing. In an example, DSP component 150 may measure the received digital signal 123 and compare it to digital signal 121 to determine whether there are any indications of problems or inconsistencies with the signals that should not be present. Any type of testing may be performed and the results may be provided to testing personnel in in manner, including transmission via output digital signal 152 to digital-to-analog (D/A) converter 128, and then via analog output signal 129 to loopback test equipment 143 or to any other equipment configured outside of satellite 100 and, in some examples, outside of an environmental chamber in which satellite 100 may be located. As built-in test component 120 and all of its components are completely within the system under test, the effects of using external testing equipment are minimized.

To test the analog payload components, software configured in built-in test component 120 may instruct, control, or otherwise cause DSP component 150 to generate a digital test signal 152 that may be provided to D/A converter 128 within analog output component 160. D/A converter 128 may generate an analog equivalent signal of digital test signal 152 that may be used by the analog components of analog output component 160. The analog test signal may be processed or otherwise manipulated by analog payload output component 160. After performing any processing of the signal by analog payload components associated with analog payload output component 160 and analog payload input component 170, analog payload input component 170 may generate and transmit an analog output signal to analog-to-digital (A/D) converter 130 for generation of a digital equivalent signal 151 of the analog output signal and transmit that signal to DSP component 150. DSP component 150 may perform any measurements and testing. In an example, DSP component 150 may measure the received digital signal 151 and compare it to digital signal 152 to determine whether there are any indications of problems or inconsistencies with the signals that should not be present. Any type of testing may be performed and the results may be provided to testing personnel in any manner, including transmission via output digital signal 152 to analog payload output component 160, and then via analog output signal 136 to loopback test equipment 143 or to any other equipment configured outside of satellite 100 and, in some examples, outside of an environmental chamber in which satellite 100 may be located. Again, because built-in test component 120 and all of its components are completely within the system under test, the effects of using external testing equipment are minimized In some examples, control signaling may be received at DSP component 150 from external test equipment via digital signal 151 that may be the digital signal corresponding to a control signal received at built-in test component 120 from external equipment. Signals from DSP component 150, such as signals indicating measurement and testing results, may be provided to external equipment via digital output signal 152 that may be relayed to external test equipment as set forth herein.

In other examples, DSP component 150 may connect the output signal of digital payload component 110 to the input of digital payload component 110, creating a loop for providing further self-testing capability. This may be combined with any digital processing that may be performed by DSP component 150. Because the test signals used in the disclosed examples may have an exact mathematical definition, any uncertainty, distortion, or limitations detected are the result of the tested components (e.g., digital payload component 110, analog payload components 160 and 170).

Note that DSP component 150 may include one or more interfaces and/or inputs and component that facilitate the programming of DSP component 150 so that an operator may configure DSP component 150 to generate test signals and perform one or more tests, measurements, evaluations, comparisons, and any number, sequence, and variety thereof. Such processing and programming capabilities may be enabled by the devices and components described herein in reference to FIG. 4. All such examples are contemplated as within the scope of the present disclosure.

Figure 2:
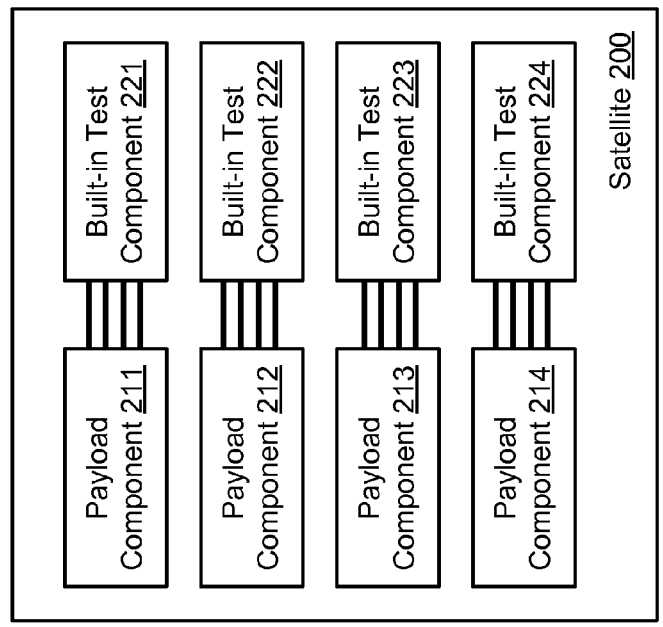
FIG. 2 depicts another example system for built-in testing of satellite payloads.

In an example, multiple built-in test components may be included in a signal satellite to allow testing of payload components in parallel, thereby reducing testing time and increasing efficiency. FIG. 2 illustrates such an example, where satellite 200 is configured with payload components 211, 212, 213, and 214, proximate to each of which is configured built-in test components 221, 222, 223, and 224, respectively. Each of these built-in test components may be configured as described above in regard to built-in test component 120.

Built-in test components as described herein may be affixed or otherwise configured in satellite payloads and communicatively connected to one or more payload components using any means or methods. In some examples, built-in test components may be installed on existing mounting hardware, and additional hardware may be added and/or existing hardware may be modified as needed. The physical connections used for connecting built-in test components to payload components may be any standard or specialized connectivity components.

Figure 3:
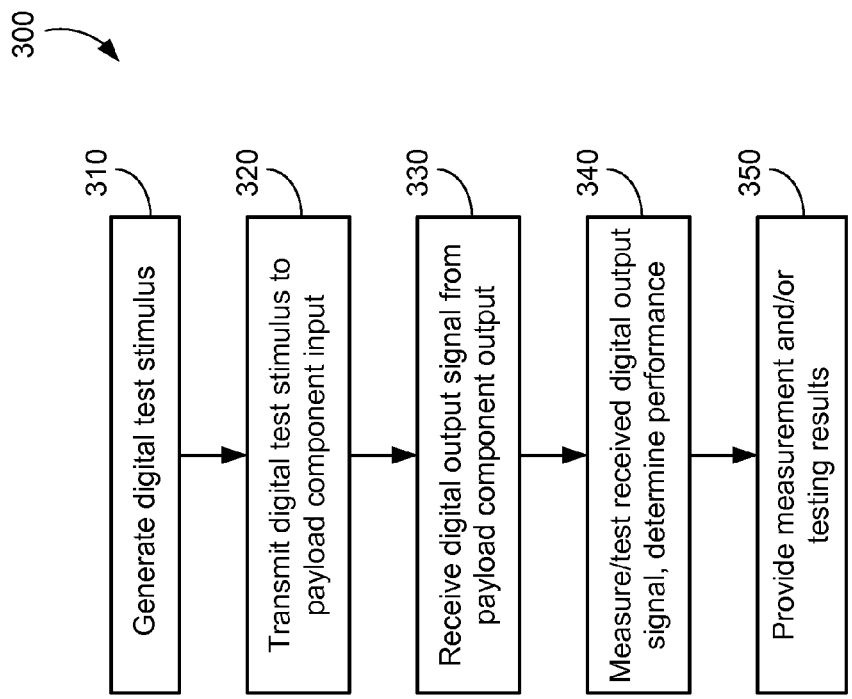
FIG. 3 illustrates a flowchart demonstrating an example method for performing built-in testing of satellite payloads.

FIG. 3 illustrates example method 300 of performing testing and/or measurement of a satellite payload component using a built-in test component as described herein. At block 310, a built-in test component may generate a digital test stimulus signal. This may be wholly generated on the built-in test component, or it may be a digitized version of a test signal received from external testing equipment. Alternatively, the test stimulus may be generated by the built-in test component in response to one or more command or instructions received by the built-in test component. In another example, the test stimulus may be received from an A/D converter at the built-in test component, where the A/D converter generated the digital test stimulus in response to receiving an analog signal from another device. In some examples, such an A/D converter may be integrated into the built-in test component. The digital test stimulus signal may be a digital signal of any type in any format, encoding, etc. All such examples are contemplated as within the scope of the present disclosure.

At block 320, the digital test stimulus signal may be transmitted or otherwise provided to a satellite payload component. This may be accomplished using any type and number of physical interfaces and connecting cables and/or wires, or any other means of ensuring that the built-in test component and the payload component are communicatively connected. Where analog payload components are being tested, the digital test signal may be provided to a D/A converter for conversion to an analog signal that may then be provided to the analog payload component.

At block 330, the digital output generated by the payload component may be received by the built-in test component. Here again, this may be accomplished using any type and number of physical interfaces and connecting cables and/or wires, or any other means of ensuring that the built-in test component and the payload component are communicatively connected. Where analog payload components are being tested, an analog output from the analog payload component under test signal may be provided to an A/D converter for conversion to a digital signal that may then be provided to the built-in test component. All such examples are contemplated as within the scope of the present disclosure.

At block 340, the digital output signal received from the payload component may be measured, tested, compared to the generated digital test stimulus, or otherwise evaluated to determine the performance of the payload component. Any methods and means of testing an output signal of a satellite payload component are contemplated as within the scope of the present disclosure.

At block 350, the results of such an evaluation of the satellite payload component may be provided to users or operators of the disclosed system. This may take any form, including transmission using wired and/or wireless means to an operator terminal or device, presentation on a display configured on the built-in test component, or any other means of communicating testing results to an operator or user. All such examples are contemplated as within the scope of the present disclosure.

By using examples of the disclosed examples, satellite manufacturers and vendors may greatly improve the speed and efficiency of testing satellite payloads, reducing costs and increasing the throughput of the satellite testing process.

Figure 4:
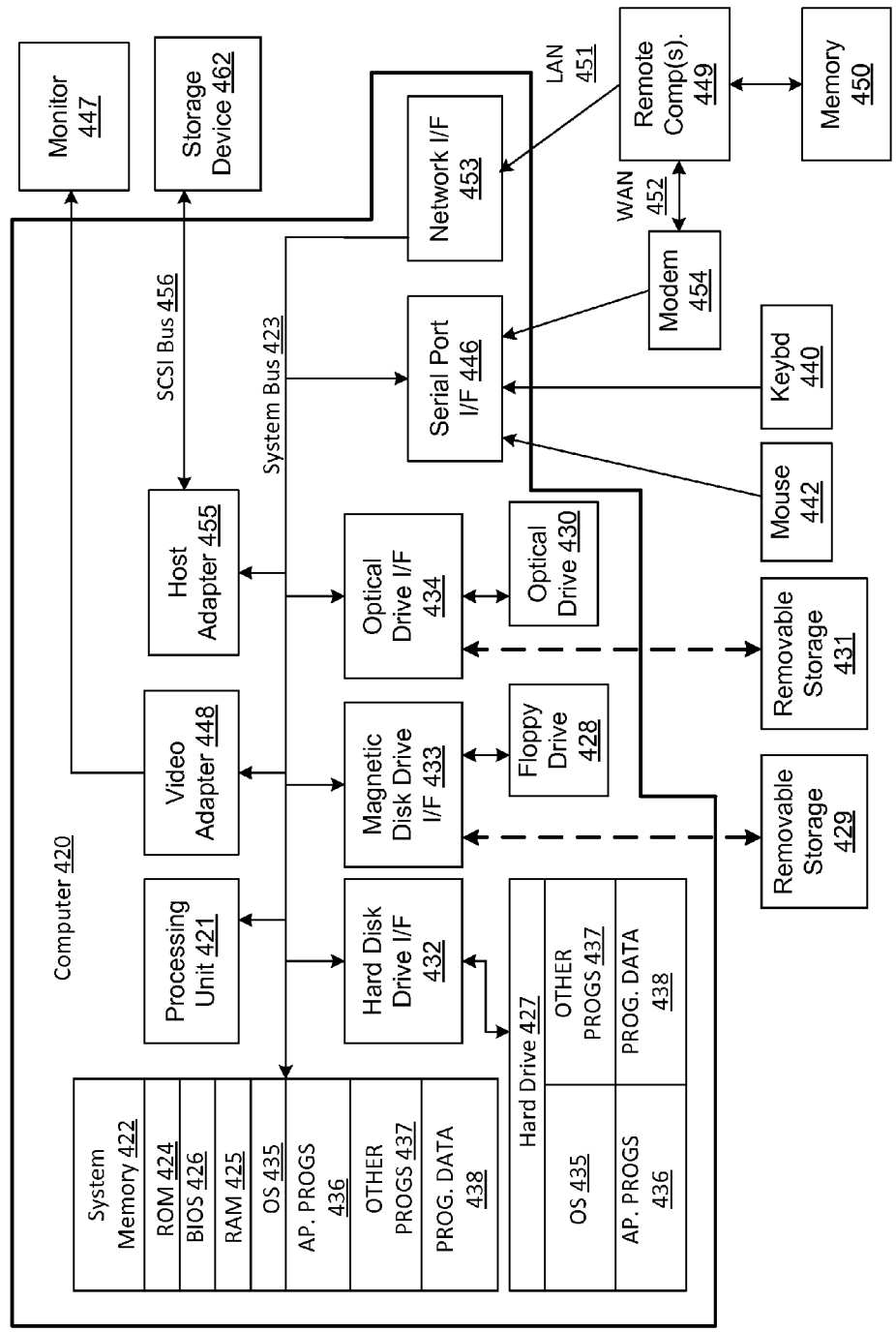
FIG. 4 depicts an example computing environment in which built-in testing of satellite payload operations according to the disclosed subject matter may be performed.

FIG. 4 and the following discussion are intended to provide a brief general description of a suitable processing environment in which the methods and systems disclosed herein and/or portions thereof may be implemented. For example, the functions of DSP components 150, built-in test components 221, 222, 223, and 224, payload components 110, 211, 212, 213, and 214, loopback test equipment 143, and any other device that may be used to implement aspects of the instant disclosure may be performed by one or more devices that include some or all of the aspects described in regard to FIG. 4. Some or all of the devices described in FIG. 4 that may be used to perform functions of the claimed examples may be configured in other devices and systems such as those described herein. Alternatively, some or all of the devices described in FIG. 4 may be included in any device, combination of devices, or any system that performs any aspect of a disclosed example.

Although not required, the methods and systems disclosed herein for built-in testing of satellite payloads may be described in the general context of computer-executable instructions, such as program modules, being executed by a computer, such as a client workstation, server, programmable processer, or personal computer. Such computer-executable instructions may be stored on any type of computer-readable storage device that is not a transient signal per se. Generally, program modules include routines, programs, objects, components, data structures and the like that perform particular tasks or implement particular abstract data types. Moreover, it should be appreciated that the methods and systems for built-in testing of satellite payloads disclosed herein and/or portions thereof may be practiced with other computer system configurations, including handheld devices, multi-processor systems, microprocessor-based or programmable consumer electronics, network PCs, minicomputers, mainframe computers and the like. The methods and systems for built-in testing of satellite payloads disclosed herein may also be practiced in distributed computing environments where tasks are performed by remote processing devices that are linked through a communications network. In a distributed computing environment, program modules may be located in both local and remote memory storage devices.

FIG. 4 is a block diagram representing a general purpose computer system in which aspects of the methods and systems for built-in testing of satellite payloads disclosed herein and/or portions thereof may be incorporated. As shown, the exemplary general purpose computing system includes computer 420 or the like, including processing unit 421, system memory 422, and system bus 423 that couples various system components including the system memory to processing unit 421. System bus 423 may be any of several types of bus structures including a memory bus or memory controller, a peripheral bus, and a local bus using any of a variety of bus architectures. The system memory may include read-only memory (ROM) 424 and random access memory (RAM) 425. Basic input/output system 426 (BIOS), which may contain the basic routines that help to transfer information between elements within computer 420, such as during start-up, may be stored in ROM 424.

Computer 420 may further include hard disk drive 427 for reading from and writing to a hard disk (not shown), magnetic disk drive 428 for reading from or writing to removable magnetic disk storage 429, and/or optical disk drive 430 for reading from or writing to removable optical disk storage 431 such as a CD-ROM or other optical media. Hard disk drive 427, magnetic disk drive 428, and optical disk drive 430 may be connected to system bus 423 by hard disk drive interface 432, magnetic disk drive interface 433, and optical drive interface 434, respectively. The drives and their associated computer-readable media provide non-volatile storage of computer-readable instructions, data structures, program modules and other data for computer 420.

Although the example environment described herein employs a hard disk, removable magnetic disk storage 429, and removable optical disk storage 431, it should be appreciated that other types of computer-readable media that can store data that is accessible by a computer may also be used in the exemplary operating environment. Such other types of media include, but are not limited to, a magnetic cassette, a flash memory card, a digital video or versatile disk, a Bernoulli cartridge, a random access memory (RAM), a read-only memory (ROM), and the like.

A number of program modules may be stored on hard disk drive 427, magnetic disk storage 429, optical disk storage 431, ROM 424, and/or RAM 425, including an operating system 435, one or more application programs 436, other program modules 437 and program data 438. A user may enter commands and information into the computer 420 through input devices such as a keyboard 440 and pointing device 442. Other input devices (not shown) may include a microphone, joystick, game pad, satellite disk, scanner, or the like. These and other input devices are often connected to the processing unit 421 through a serial port interface 446 that is coupled to the system bus, but may be connected by other interfaces, such as a parallel port, game port, or universal serial bus (USB). A monitor 447 or other type of display device may also be connected to the system bus 423 via an interface, such as a video adapter 448. In addition to the monitor 447, a computer may include other peripheral output devices (not shown), such as speakers and printers. The exemplary system of FIG. 4 may also include host adapter 455, Small Computer System Interface (SCSI) bus 456, and external storage device 462 that may be connected to the SCSI bus 456.

The computer 420 may operate in a networked environment using logical and/or physical connections to one or more remote computers or devices, such as remote computer 449, that may represent any remote computer or device with which computer 420 may communicate. Remote computer 449 may be a personal computer, a server, a router, a network PC, a peer device or other common network node, and may include many or all of the elements described above relative to the computer 420, although only a memory storage device 450 has been illustrated in FIG. 4. The logical connections depicted in FIG. 4 may include local area network (LAN) 451 and wide area network (WAN) 452. Such networking environments are commonplace in police and military facilities, offices, enterprise-wide computer networks, intranets, and the Internet.

When used in a LAN networking environment, computer 420 may be connected to LAN 451 through network interface or adapter 453. When used in a WAN networking environment, computer 420 may include modem 454 or other means for establishing communications over wide area network 452, such as the Internet. Modem 454, which may be internal or external, may be connected to system bus 423 via serial port interface 446. In a networked environment, program modules depicted relative to computer 420, or portions thereof, may be stored in a remote memory storage device. It will be appreciated that the network connections shown are exemplary and other means of establishing a communications link between computers may be used.

Computer 420 may include a variety of computer-readable storage media. Computer-readable storage media can be any available tangible, non-transitory, or non-propagating media that can be accessed by computer 420 and includes both volatile and nonvolatile media, removable and non-removable media. By way of example, and not limitation, computer-readable media may comprise computer storage media and communication media. Computer storage media include volatile and nonvolatile, removable and non-removable media implemented in any method or technology for storage of information such as computer-readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium that can be used to store the desired information and that can be accessed by computer 420. Combinations of any of the above should also be included within the scope of computer-readable media that may be used to store source code for implementing the methods and systems described herein. Any combination of the features or elements disclosed herein may be used in one or more examples.

It will be appreciated that, while processor-executable instructions are described as being stored in memory or on storage while being used, these instructions or portions of them may be transferred between memory and other storage devices. Alternatively, in other examples some or all of the instructions may execute in memory on another device and communicate with the described systems via inter-computer communication. In some examples, some or all of the systems and/or instructions may be implemented or provided in other ways, such as at least partially in firmware and/or hardware, including, but not limited to, one or more ASICs, standard integrated circuits, controllers (e.g., by executing appropriate instructions, and including microcontrollers and/or embedded controllers), field programmable gate arrays (FPGAs), complex programmable logic devices (CPLDs), etc. Some or all of the instructions, systems and data structures may also be stored (e.g., as software instructions or structured data) on a computer-readable medium, such as a hard disk, a memory, a network, or a portable media article to be read by an appropriate drive or via an appropriate connection. The systems, instructions, and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other examples. Accordingly, the present invention may be practiced with other computer system configurations.

In some examples, a system memory may be used that is a computer-readable storage medium configured to store program instructions and data as described above for FIGS. 1-3 for implementing examples of the corresponding methods and systems for built-in testing of satellite payloads. However, in other examples, program instructions and/or data may be received, sent or stored upon different types of computer-accessible media. Generally speaking, a computer-readable storage medium may include non-transitory and tangible storage media or memory media such as magnetic or optical media, e.g., disk or DVD/CD coupled to a computer system or gateway device. A computer-readable storage medium may also include any volatile or non-volatile media such as RAM (e.g., SDRAM, DDR SDRAM, RDRAM, SRAM, etc.), ROM, etc., that may be included in some examples of the computer systems described above as system memory or another type of memory. Portions or all of the systems such as those illustrated herein may be used to implement the described functionality in various examples. For example, software components running on a variety of different devices and servers may collaborate to provide the disclosed functionality.

It will be appreciated that in some examples the functionality provided by the routines discussed above may be provided in alternative ways, such as being split among more routines or consolidated into fewer routines. Similarly, in some examples, illustrated routines may provide more or less functionality than is described, such as when other illustrated routines instead lack or include such functionality respectively or when the amount of functionality that is provided is altered. In addition, while various operations may be illustrated as being performed in a particular manner (e.g., in serial or in parallel) and/or in a particular order, in other examples the operations may be performed in other orders and in other manners. Similarly, the data structures discussed above may be structured in different ways in other examples, such as by having a single data structure split into multiple data structures or by having multiple data structures consolidated into a single data structure, and may store more or less information than is described (e.g., when other illustrated data structures instead lack or include such information respectively, or when the amount or types of information that is stored is altered).

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

In general, the various features and processes described above may be used independently of one another, or may be combined in different ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example examples. The example systems and components described herein may be configured differently than described. For example, elements may be added to, removed from, or rearranged compared to the disclosed example examples.

While certain example or illustrative examples have been described, these examples have been presented by way of example only, and are not intended to limit the scope of the inventions disclosed herein. Indeed, the novel methods and systems described herein may be embodied in a variety of other forms. The accompanying claims and their equivalents are intended to cover such forms or modifications as would fall within the scope and spirit of certain of the inventions disclosed herein.

The invention claimed is:

1. A testing system for a satellite payload, the testing system comprising:
   a built-in testing component installed in a satellite, the built-in testing component comprising a built-in testing component input and a built-in testing component output; and
   a payload component installed in the satellite, the payload component comprising a payload component input communicatively connected to the built-in testing component output and a payload component output communicatively connected to the built-in testing component input,
      wherein the built-in testing component is configured to transmit a digital test signal from the built-in testing component output to the payload component input and receive a digital output signal at the built-in testing component input from the payload component output;
      wherein the built-in testing component is configured to transmit the digital output signal from the payload component output to the payload component input to create a loop for loopback testing; and
      wherein the digital test signal is generated so that any added distortion is a result of tested components.

2. The testing system of claim 1, wherein the built-in testing component is further configured to generate the digital test signal.

3. The testing system of claim 2, wherein the built-in testing component is further configured to generate the digital test signal in response to receiving a test signal from an external stimulus device.

4. The testing system of claim 2, wherein the built-in testing component is further configured to generate the digital test signal in response to receiving an instruction to generate the digital test signal.

5. The testing system of claim 1, wherein the built-in testing component is further configured to evaluate the digital output signal received from the payload component output.

6. The testing system of claim 5, wherein the built-in testing component is further configured to transmit results of evaluating the digital output signal received from the payload component output to an external device.

7. The testing system of claim 1, wherein the satellite is configured in an environmental chamber.

8. A testing system for a satellite payload, the testing system comprising:
 a plurality of built-in testing components installed in a satellite, each of the plurality of built-in testing components comprising a built-in testing component input and a built-in testing component output; and
 a payload component installed in the satellite, the payload component comprising a plurality of payload component inputs each communicatively connected to a respective one of the built-in testing component outputs and a plurality of payload component outputs each communicatively connected to a respective one of the built-in testing component inputs,
  wherein each of the plurality of built-in testing components is configured to transmit a digital test signal from its built-in testing component output to a respective payload component input and receive a digital output signal at its built-in testing component input from a respective payload component output;
  wherein the built-in testing components are configured to transmit the digital output signal from the payload component outputs to the payload component inputs to create a loop for loopback testing; and
  wherein the digital test signal is generated so that any added distortion is a result of tested components.

9. The testing system of claim 8, wherein each of the plurality of built-in testing components is further configured to generate the digital test signal.

10. The testing system of claim 9, wherein each of the plurality of built-in testing components is further configured to generate the digital test signal in response to receiving a test signal from an external stimulus device.

11. The testing system of claim 9, wherein each of the plurality of built-in testing components is further configured to generate the digital test signal in response to receiving an instruction to generate the digital test signal.

12. The testing system of claim 8, wherein each of the plurality of built-in testing components is further configured to evaluate the digital output signal received from the respective payload component output.

13. The testing system of claim 12, wherein each of the plurality of built-in testing components is further configured to transmit results of evaluating the digital output signal received from the respective payload component output to an external device.

14. The testing system of claim 8, wherein the satellite is configured in an environmental chamber.

15. A method of testing a payload component configured at a satellite, the method comprising:
 transmitting, from a built-in testing component comprising a built-in testing component input and a built-in testing component output, a digital test signal from the built-in testing component output to a payload component input; and
 receiving, at the built-in testing component input from a payload component output, a digital output signal,
  wherein the built-in testing component and the payload component are configured at the satellite
  wherein the payload component input is communicatively connected to the built-in testing component output and the payload component output is communicatively connected to the built-in testing component input and the payload component input to create a loop for loopback testing; and
  wherein the digital test signal is generated so that any added distortion is a result of tested components.

16. The method of claim 15, further comprising generating the digital test signal at the built-in testing component.

17. The method of claim 16, wherein generating the digital test signal at the built-in testing component comprises generating the digital test signal in response to receiving a test signal from an external stimulus device.

18. The method of claim 16, wherein generating the digital test signal at the built-in testing component comprises generating the digital test signal in response to receiving an instruction to generate the digital test signal.

19. The method of claim 15, further comprising evaluating the digital output signal received from the payload component output at the built-in testing component.

20. The method of claim 19, further comprising transmitting, by the built-in testing component to an external device, results of evaluating the digital output signal received from the payload component output.

\* \* \* \* \*